(12) United States Patent
George et al.

(10) Patent No.: US 6,818,250 B2
(45) Date of Patent: Nov. 16, 2004

(54) METHOD FOR FORMING SIO2 BY CHEMICAL VAPOR DEPOSITION AT ROOM TEMPERATURE

(75) Inventors: Steven M. George, Boulder, CO (US); Jason W. Klaus, Portland, OR (US)

(73) Assignee: The Regents of the University of Colorado, Boulder, CO (US)

( * ) Notice: Subject to any disclaimer, the term of this patent is extended or adjusted under 35 U.S.C. 154(b) by 122 days.

(21) Appl. No.: 09/896,955

(22) Filed: Jun. 29, 2001

(65) Prior Publication Data

US 2002/0018849 A1 Feb. 14, 2002

Related U.S. Application Data

(60) Provisional application No. 60/215,381, filed on Jun. 29, 2000.

(51) Int. Cl.[7] .............................................. C23C 16/40

(52) U.S. Cl. ........................ 427/255.15; 427/255.18; 427/255.17; 427/255.37; 427/255.7

(58) Field of Search ..................... 427/255.15, 255.18, 427/255.17, 255.37, 255.7

(56) References Cited

U.S. PATENT DOCUMENTS 6,090,442 A * 7/2000 Klaus et al. ........... 427/255.15

OTHER PUBLICATIONS

Klaus et al. Science, vol. 278, Dec. 12, 1997, pp. 1934–1936.*
Deal et al., Electrical Properties of Vapor–Deposited Silicon Nitrate . . . Mar. 1968, J. Electrochem. Soc., pp. 300–307.
Van Cauwelaert et al., Infra–Red Spectroscopic Study of the Absorption of . . . Jun. 1971, Laboratorium voor Oppervlaktescheikunde, pp. 66–76.

Goto et al., Dielectric Properties of Chemically Vapor–Deposited $Si_3N_4$, 1989, Journal of Materials Science 24, pp. 821–826.
Blitz et al., The Role of Amine Structure on Catalytic Activity . . . , 1988, Journal of Colloid and Interface Science–vol. 26–No. 2, pp. 387–392.
Blitz et al., Ammonia–catalyzed silylation Reactions of CAB–O–SIL With Methoxymethylsilanes, 1987, J. Am. Chem. Soc., pp. 7141–7145.
Adams et al., The Deposition of Silicon Dioxide Films at Reduced Pressure, Jun. 1979, J. Electrochem. Soc. pp. 1042–1046.
Wanatabe et al., The Properties of LPCVD $SiO_2$ Film . . . , Dec. 1981, J. Electrochem. Soc. pp. 2630–2635.
Becker et al., Low Pressure Deposition of High–Quality $SiO_2$ Films . . . , 1987, J. Vac. Sci. Technol. B 5 (6), pp. 1555–1563.
Kern et al., Advances is Deposition Processes For Passivation Films, 1977, J. Vac. Sci. Technol.–vol. 14–No. 5, pp. 1082–1099.
Morishita et al., Atomic–Layer Chemical–Vapor–Deposition of $SiO_2$. . . , 1995, Jpn. J. Appl. Phys. vol. 34, pp. 5738–5742.

(List continued on next page.)

Primary Examiner—Timothy Meeks
(74) Attorney, Agent, or Firm—Gary C Cohn PLLC

(57) ABSTRACT

Silicon dioxide ($SiO_2$) films are deposited at room temperature using a chemical vapor deposition (CVD) reaction catalyzed by ammonia or a Lewis base. The $SiO_2$ film growth is accomplished through the reaction of water and certain silicon precursors. Examples of these reactions include the $SiCl_4 + 2H_2O \rightarrow SiO_2 + 4HCl$ or $Si(OR)_4 + 2H_2O \rightarrow SiO_2 + 4ROH$ reactions and catalyzed with ammonia ($NH_3$) or other Lewis bases. The $NH_3$ catalyst lowered the required temperature for $SiO_2$ CVD from >900 K to 313–333 K and reduced the $SiCl_4$ and $H_2O$ pressures required for efficient $SiO_2$ CVD from several Torr to <500 mTorr.

12 Claims, 9 Drawing Sheets

OTHER PUBLICATIONS

Morishita et al., New Substances for Atomic–Layer Deposition of Silicon Dioxide, 1995, Journal of Non–Crystalline Solids 187, pp. 66–69.

Tripp et al., Chemical Attachment of Chorosilanes to Silica . . . , 1993, J. phys. Chem. 97, pp. 5693–5698.

Ehrlich et al., Fast Room Temperature Growth of $SiO_2$ Films . . . , 1991, Appl. Phys. Lett 58 (23), pp. 2675–5677..

Klaus et al., Atomic Layer Controlled Growth of $Si_3N_4$. . . , 1998, Surface Science, pp. L14–L19.

Klaus et al., Atomic Layer Deposition of $SiO_2$. . . , 2000, Surface Science 447, pp. 81–90.

Klaus et al., Atomic Layer Deposition of $SiO_2$. . . , 1999, Surface Review and Letters–vol. 6–Nos. 3 and 4. pp. 435–448.

Klaus et al., Growth of $SiO_2$ at Room Temperature . . . , Dec. 1997, Science–vol. 278, pp. 1934–1936.

* cited by examiner

Side View

Top View

METHOD FOR FORMING SIO2 BY CHEMICAL VAPOR DEPOSITION AT ROOM TEMPERATURE

CROSS-REFERENCE TO RELATED APPLICATION

This application claims benefit of provisional application 60/215,381, filed Jun. 29, 2000 and incorporated herein by reference. The U.S. government has a paid-up license in this invention and the right in limited circumstances to require the patent owner to license to others on reasonable terms as provided for by the terms of contract no. F49620-99-1-0081, awarded by the United States Department of Energy.

BACKGROUND OF THE INVENTION

Chemical vapor deposition (CVD) is one of the most widely practiced thin film deposition techniques. Advances in CVD technology have fueled the deployment of many new technologies, including silicon microelectronic processing. One of the key goals for the fabrication of future silicon devices is lower deposition temperatures. These low growth temperatures will limit interlayer and dopant diffusion and facilitate the use of temperature sensitive substances such as polymers or biological materials.

The chemical vapor deposition of $SiO_2$ is ubiquitous in silicon device fabrication. $SiO_2$ CVD films compete effectively with thermal $SiO_2$ that is formed by the reaction of oxygen with the silicon substrate at 900–1200 K. $SiO_2$ CVD is performed at various temperatures that can be significantly lower than the required temperatures for thermal $SiO_2$ growth. At high temperatures of ~1200 K, excellent $SiO_2$ films with properties close to thermal $SiO_2$ can be grown using the reaction $SiH_2Cl_2 + 2NO \rightarrow SiO_2 + 2N_2 + 2HCl$. At medium temperatures of ~900–1000 K, very reasonable $SiO_2$ dielectric films are deposited using tetraethyl orthosilicate (TEOS) decomposition. Several earlier investigations have reported the kinetics of $SiO_2$ CVD using $SiCl_4$ and $H_2O$. These studies observed efficient $SiO_2$ CVD only at temperatures greater than 900 K. At fairly low temperatures of ~500–700 K, $SiO_2$ films with a lower density than thermal $SiO_2$ can be deposited using the reaction $SiH_4 + O_2 \rightarrow SiO_2 + 2H_2O$.

$SiO_2$ deposition at temperatures as low as room temperature has been the focus of recent research. Plasma processing is often used to lower film deposition temperatures. However, the drawbacks to plasma processing are particle contamination, surface damage from the energetic plasma species and high interface defect density. The use of novel molecular precursors has also been explored for low temperature $SiO_2$ growth. However, these precursors are usually expensive, and the $SiO_2$ films deposited with these precursors have not been device quality.

Amine catalysts have been used for the attachment of chlorosilanes and organosilanes to silica surfaces. See C. P. Tripp and M. L. Hair, J. Phys. Chem. 97, 5693 (1993) and J. P. Blitz et al., J. Amer. Chem. Soc. 109, 7141 (1987). The use of a catalyst has also recently been reported for $SiO_2$ atomic layer deposition (ALD) using sequential surface reactions. These $SiO_2$ ALD investigations used either pyridine ($C_5H_5N$) or ammonia ($NH_3$) as the catalyst during sequential exposures to $SiCl_4$ and $H_2O$. See J. W. Klaus, O. Sneh, A. W. Ott and S. M. George, Surface Review & Letters 6, 435 (1999) and J. W. Klaus, O. Sneh, A. W. Ott and S. M. George, Science 278, 1934 (1997). These previous studies demonstrated that Lewis base molecules can catalyze $SiO_2$ ALD at room temperature. Recent ab initio theoretical calculations have confirmed the catalytic effect of $NH_{3\ on}$ the $SiCl_4$ and $H_2O$ half-reactions occurring during $SiO_2$ ALD. Y. Okamoto, J. Phys. Chem. B 103, 11074 (1999).

SUMMARY OF THE INVENTION

Figure 1:
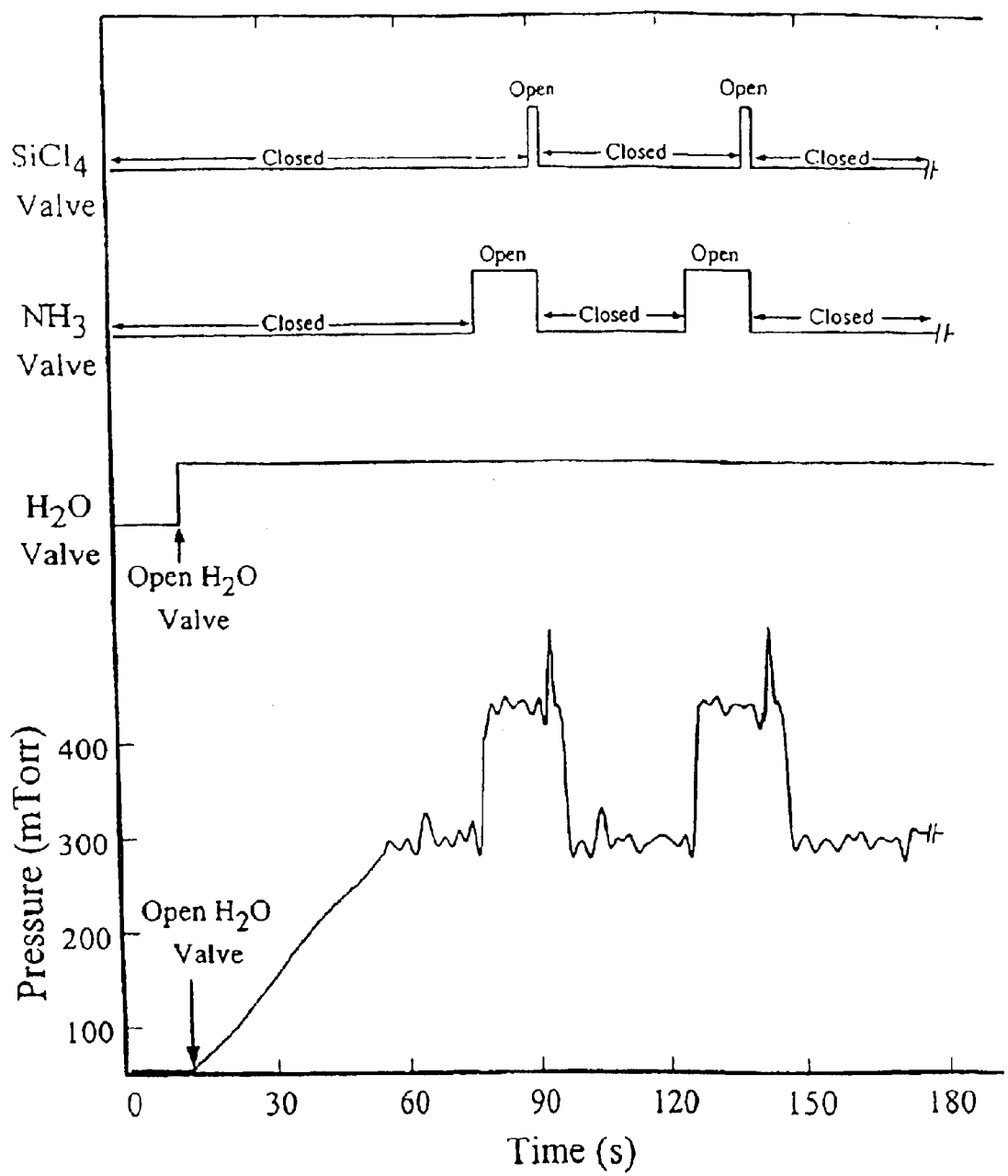
FIG. 1 is a graphical depiction illustrating the sequencing of reactants and catalyst addition for Example 1.

This invention is a chemical vapor deposition process for forming a $SiO_2$ layer on a substrate comprising reacting water with a silicon precursor compound having the structure $SiX_4$, $Si(NR_2)_4$, $Si(OH)_a(OR)_{4-a}$ or $SiH_b(OR)_{4-b}$ wherein each R is an alkyl group, each X is independently a halogen atom, and a and b are numbers from 0–4, in the presence of the substrate at a temperature of between about 290 K and 350 K and in the presence of ammonia or a Lewis base that is a gas under the conditions of the chemical vapor deposition process.

This process permits the formation of high quality $SiO_2$ coatings on various substrates, most notably on a silicon substrate, using a low temperature process. The process is easily controllable to form conformal $SiO_2$ layers of a desired thickness. Lower deposition temperatures are particularly important to limit interlayer and dopant diffusion as thin film device sizes approach nanoscale dimensions.

DETAILED DESCRIPTION OF THE INVENTION

In this invention, an $SiO_2$ layer is formed on a substrate by the reaction of water with a silicon precursor compound. The silicon precursor compound has the structure $SiX_4$, $Si(NR_2)_4$, $Si(OH)_a(OR)_{4-a}$ or $SiH_b(OR)_{4-b}$ wherein each R is an alkyl group, each X is independently a halogen atom, and a and b are numbers from 0–4. X is preferably chloride ion. R is preferably a $C_1$–$C_4$ alkyl such as methyl, ethyl, n-propyl, isopropyl, n-butyl, t-butyl or sec-butyl. a and b are each preferably from 0–3, more preferably from 0–2 and most especially 0. SiCl$_4$ and tetraethyl orthosilicate (TEOS, where each R is ethyl) are especially preferred silicon precursors. The overall reaction is represented by one or more of the (unbalanced) equations $$SiX_4 + 2H_2O \rightarrow SiO_2 + 4HX \qquad (I)$$

$$Si(NR_2)_4 + 2H_2O \rightarrow SiO_2 + 4HNR_2 \qquad (II)$$

$$Si(OH)_a(OR)_{4-a} + 2H_2O \rightarrow SiO_2 + 4ROH \qquad (III) \text{ and}$$

$$SiH_b(OR)_{4-b} + 2H_2O \rightarrow SiO_2 + 4ROH \qquad (IV)$$

The substrate can be any substrate on which an SiO$_2$ layer can be deposited. A highly preferred substrate is silicon, especially an Si(100) wafer. In addition to applications in manufacturing semiconductor devices, low temperature SiO$_2$ CVD may be used to deposit insulating and protective SiO$_2$ coatings on a variety of materials, including thermally sensitive materials such as polymers and biological materials. Among such other substrates are nitrides such as aluminum nitride, boron nitride or silicon nitride; oxides such as alumina, titania, or zeolites, metals, carbides such as titanium carbide, boron carbide, silicon carbide, tungsten carbide, and the like. In most cases, the SiO$_2$ layer will become chemically bound to the substrate through oxygen atoms on the substrate surface.

The catalyst is ammonia or a Lewis base that is a gas under the conditions of the reaction. The Lewis base preferably has a nitrogen atom. Those having H-bond strengths towards Lewis acid sites similar to ammonia and pyridine are especially suitable. Among such catalysts are pyridine, primary, secondary or tertiary amines such as monoalkyl amines (ethyl amine, n-propyl amine, n-butyl amine, t-butyl amine and the like); dialkyl amines such as dimethyl amine, diethyl amine, di-n-propyl amine, methyl ethyl amine and the like) and trialkyl amines (trimethyl amine, triethyl amine and the like). Ammonia is most preferred on the basis of catalytic activity and ease of use.

In accordance with the invention, the foregoing reaction is conducted in a chemical vapor deposition process. In general, this process comprises subjecting the substrate to the reactant under conditions of temperature and pressure so that the reactants and catalyst are in the gaseous state. The reactants react on the surface of the substrate to form an SiO$_2$ layer on its surface. At the temperature range of interest, 290–350 K, especially 313–333 K, pressures are selected so that the reactants assume a gaseous state. In general, the substrate is contacted with reactants at a pressure that is preferably less than 50 Torr, more preferably less than 10 Torr and even more preferably less than 5 Torr. Thus, the process is generally conducted within an evacuated chamber into which the reactants and catalysts can be fed under controlled subatmospheric pressures. The reaction vessel is preferably adapted to be evacuated to low pressures such as $1 \times 10^{-6}$ Torr, preferably $1 \times 10^{-7}$ Torr, especially $1 \times 10^{-8}$ Torr. Suitable such equipment is described in A. W. Ott, J. W. Klaus, J. M. Johnson and S. M. George, Thin Solid Films 292, 135 (1996), incorporated herein by reference.

The chemical vapor deposition process includes the simultaneous addition of the reactants, or at least one of the reactants and the catalyst, so that some mixing occurs in the vapor phase. Typically, the silicon precursor is added simultaneously with water or the catalyst, preferably both. A preferred mode of addition is to introduce water vapor continuously or over relatively long periods. During the water addition, catalyst and silicon precursor are added intermittently in "pulses" of short duration. In this manner, there are periods of time in which only water is being introduced into the reaction, and other periods of time in which water and catalyst are being added simultaneously and still other periods of time in which water and the silicon precursor (and still more preferably, the catalyst) are added simultaneously. This permits the surface of the substrate to first become coated with a thin layer of water molecules, which are then coated with a thin layer of catalyst molecules, and then with a thin layer of the silicon precursor, at which point the reaction between the water and silicon precursor takes place, forming a very thin SiO$_2$ layer. A certain amount of mixing of the reactants and/or catalyst will occur in the vapor phase, and a certain amount of simultaneous deposition of these materials onto the substrate will occur. Repeated sequential applications of the reactants and catalyst form or increase the thickness of the layer. It is believed that a contiguous SiO$_2$ layer may be created from "islands" of SiO$_2$ that are formed during the first or first several applications of the reactants and catalysts, and which grow and are joined together during subsequent applications of the reactants and catalysts.

In an especially preferred method, water vapor is used not only as a reactant, but also as purge stream that helps to flush away excess quantities of the catalyst and silicon precursor as well as by-products of the reaction. In this especially preferred method, water vapor can be introduced continuously into the reactor, with the catalyst and silicon precursor being "pulsed" (i.e., added to the reactor under pressure for an interval of time) into the reactor periodically. The catalyst and silicon precursor "pulses" are preferably performed with the catalyst being introduced first, followed by the silicon precursor. In an especially preferred process, the catalyst is pulsed into the reactor, and the silicon precursor is pulsed into the reactor near the end of the catalyst pulse, so that the silicon precursor is introduced simultaneously with the last portion of the catalyst pulse. Between pulses of catalyst/silicon precursor, it is preferred to purge the reactor with water or an inert gas, in order to remove excess raw materials and by-products of the reaction.

The amount of reactants and catalyst that are introduced in a given addition will depend on the pressure and the length of time of the addition. For catalyst and silicon precursor additions, it has been found that most efficient SiO$_2$ layer growth is achieved when each addition is sufficient to deposit approximately a monolayer of molecules on the surface of the substrate. Adding greater amounts contributes little to the rate of SiO$_2$ growth and may tend to cause the SiO$_2$ layer to become less uniform, whereas adding substantially less tends to slow the rate of SiO$_2$ layer growth.

For any particular apparatus and substrate, suitable pulse lengths and pressures can be determined empirically. A preferred set of conditions includes adding H$_2$O in pulses or continuously until an H$_2$O partial pressure of about 50 to about 5,000 mTorr, especially 100 to 500 mTorr, is achieved. Catalyst pulsing is preferably done to achieve a catalyst partial pressure of about 50 to about 2500 mTorr, preferably about 50 to about 1000 mTorr, more about 100 to about 500 mTorr, especially about 100 to 300 mTorr. Silicon precursor pulsing is preferably done to achieve silicon precursor partial pressure of from about 2 to about 2500 mTorr, preferably from about 5 to about 500 mTorr, more preferably from about 5 to about 200 mTorr.

The process is continued until a film of SiO$_2$ of the desired thickness is deposited onto the substrate. The film thickness may range from about 10 nm to any desired thickness, provided that the deposition process is repeated enough times. The process of the invention is particularly suitable for forming layers of from about 50 to about 1000 nm.

HCl, dialkylamines and/or alcohols are produced when the water reacts with the various silicon precursors. The catalyst may then form reaction by-products, particularly ammonium chlorides when HCl reacts with $NH_3$. These by-products may become affixed to the surface of the growing $SiO_2$ film. Purging the reactor between reaction sequences tends to remove these by-products as well as other impurities that may form. Thus, it is preferred to separate each sequence of reactions with a purge of an inert gas, or preferably, water vapor. The purge may continue for up to 1 minute or more, depending on the particular conditions and design of the reactor, but often a purge of from about 1 to about 50 seconds, especially from about 10 to about 50 seconds, is adequate to remove most of the by-products and form a good quality film.

The following examples are provided to illustrate the invention, but are not intended to limit its scope. All parts and percentages are by weight unless otherwise indicated. These examples are conducted in an apparatus as described in A. W. Ott, J. W. Klaus, J. M. Johnson and S. M. George, Thin Solid Films 292, 135 (1996). The apparatus includes a sample load lock chamber, a central deposition chamber, and an ultra high vacuum chamber for surface analysis. The central deposition chamber is designed for automated dosing of gas phase precursors under a wide variety of conditions. The deposition chamber is pumped with either a 175 l/s diffusion pump equipped with a liquid $N_2$ trap or two separate liquid $N_2$ traps backed by mechanical pumps. This chamber has a base pressure of $1\times10^{-7}$ Torr. The central deposition chamber contains an in situ spectroscopic ellipsometer (J. A. Woolam Co. M-44) that collects ellipsometric data simultaneously at 44 visible wavelengths. The ellipsometer is mounted on ports positioned at 80° with respect to the surface normal. Gate valves on the ports protect the birefringent-free ellipsometer windows from deposition during film growth. The surface analysis chamber houses a UTI-100C quadrupole mass spectrometer and is pumped by a 210 l/s turbo pump to a base pressure of $1\times10^{-8}$ Torr. Mass spectometric analysis of the gases in the central deposition chamber can be performed using a controlled leak to the surface analysis chamber.

The sample substrates were 0.75×0.75 inch Si(100) wafers. The Si(100) samples were p-type, boron-doped with a resistivity of $\rho$=0.1–0.4 $\Omega$cm. A 3000 Å Mo film deposited on the backs of the samples was used for resistive heating to >1100 K. The Si(100) samples were cleaned in HF to remove the native oxide. The Si(100) surface was further cleaned in vacuum by annealing at 875 K for 1 minute. This anneal was followed by a high frequency $H_2O$ plasma discharge at 300 K to hydroxylate the surface and remove surface carbon contamination. The cleaning procedure leaves a very thin $SiO_2$ film on the Si(100) substrate.

EXAMPLE 1

$SiO_2$ Deposition onto Si(100) Wafers $SiO_2$ deposition experiments were performed using the reaction sequence illustrated in FIG. 1. A steady-state pressure of $H_2O$ was maintained in the central deposition chamber by continuously flowing $H_2O$ through the chamber. The $H_2O$ pressure was controlled by varying the conductance between the chamber and the pumps using an in-line butterfly valve. The $NH_3$ catalyst and $SiCl_4$ precursor were then introduced into the deposition chamber using automated valves. The $NH_3$ pressure was controlled using the regulator on the $NH_3$ gas cylinder. The $SiCl_4$ precursor was pulsed into the deposition chamber after establishing the $NH_3$ pressure. The $SiCl_4$ exposure was defined by opening the $SiCl_4$ automated valve for 50 ms. This $SiCl_4$ pulse yielded a peak $SiCl_4$ pressure of ~5 mTorr as measured by a capacitance manometer on the deposition chamber. Following the $NH_3/SiCl_4$ pulse sequence, the $NH_3$ and $SiCl_4$ valves were closed, and the continuous $H_2O$ flow purged the chamber. A purge time of 20–60 secs was required to reestablish the steady-state $H_2O$ pressure.

The $NH_3$ catalyst can form complexes with HCl reaction product to yield $NH_4Cl$ salt. $NH_4Cl$ has a vapor pressure of $4\times10^{-5}$ Torr at 300 K. The $H_2O$ purge also removed the $NH_4Cl$ from the $SiO_2$ surface and the chamber walls.

The $SiO_2$ film thickness was evaluated after 30 identical $NH_3/SiCl_4$ pulses using the in situ spectroscopic ellipsometer. Bulk $SiO_2$ optical constants were initially assumed because the refractive index of very thin films is difficult to determine. The accuracy of this assumption was tested by collecting ex situ data on a 1000 Å thick $SiO_2$ film at multiple angles of incidence. This examination permits an accurate determination of the $SiO_2$ optical constants. The measured index of refraction of 1.43±0.03 for the catalyzed $SiO_2$ CVD films agrees with the refractive index of 1.46 for dense thermal $SiO_2$ films.

EXAMPLE 2

Comparison of Film Growth With and Without $NH_3$ Catalyst

Figure 2:
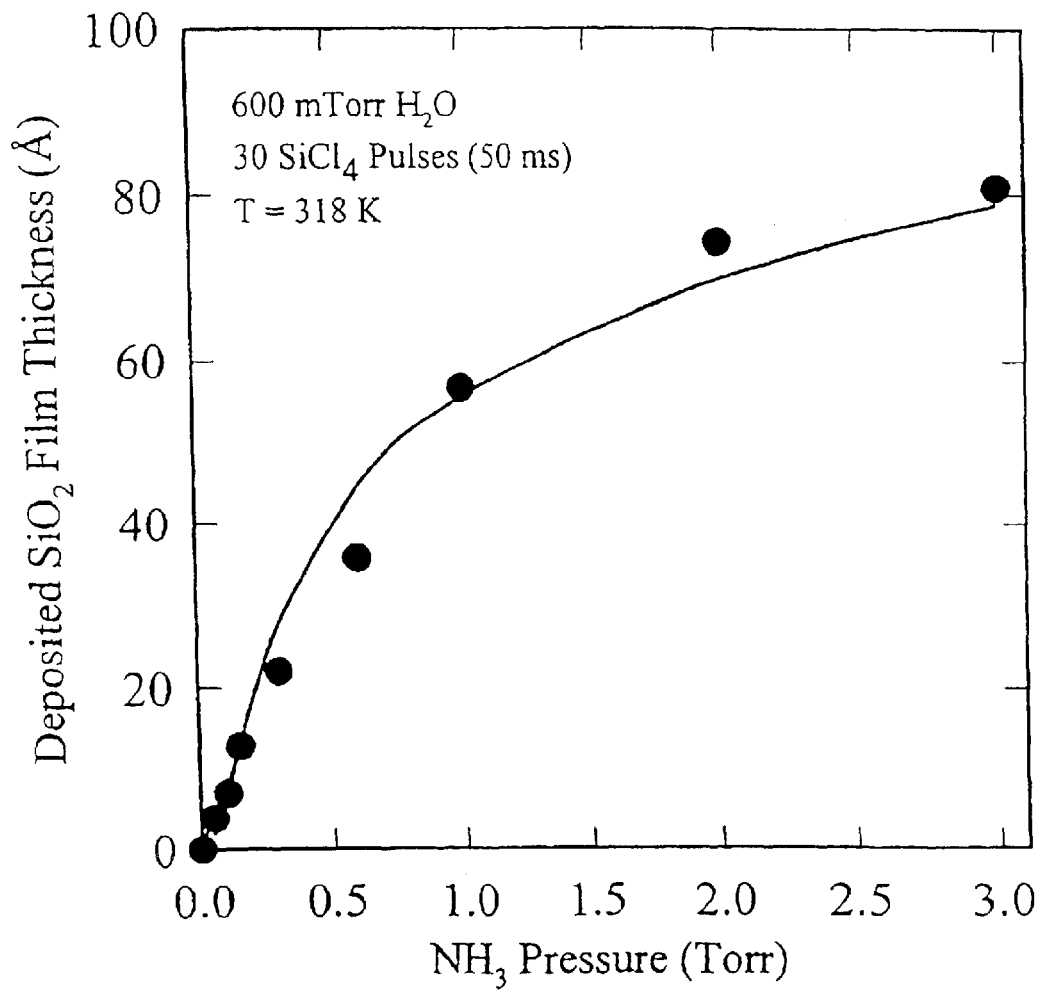
FIG. 2 is a graph of $SiO_2$ film thickness deposited by 30 consecutive $NH_3/SiCl_4$ pulses at 600 mTorr and 318 K versus $NH_3$ pressure under the conditions of Example 2.

When example 1 is repeated without using any $NH_3$ catalyst, no $SiO_2$ CVD film growth was observed at any temperature between 300–700 K for $SiCl_4$ and at $H_2O$ pressures as high as to 2 Torr. In contrast, the addition of a small amount of $NH_3$ initiated immediate $SiO_2$ growth at 313–333 K. The effect of the $NH_3$ catalyst was quantified by measuring the $SiO_2$ film thickness deposited by 30 consecutive $NH_3/SiCl_4$ pulses at 318 K versus $NH_3$ pressure. These in situ spectroscopic ellipsometry measurements are shown in FIG. 2. The solid line is intended only to guide the eye. The steady-state $H_2O$ pressure was 600 mTorr and the $SiCl_4$ pulse length was fixed at 50 ms for the results shown in FIG. 2. $H_2O$ was allowed to purge the deposition chamber for 20 seconds between each $NH_3/SiCl_4$ pulse. The $H_2O/NH_3/SiCl_4$ reaction cycle occurred with the following sequence: Flow $H_2O$ (600 mTorr)/Flow $NH_3$(0–3 Torr)/Pulse $SiCl_4$(50 ms)/Close $SiCl_4$ and $NH_3$ valves/Flow $H_2O$ (20 sec). FIG. 2 shows that the deposited $SiO_2$ film thickness increases rapidly with increasing $NH_3$ pressures up to 3.0 Torr. $NH_3$ pressures >3.0 Torr were not attainable during the reaction cycles when the deposition chamber was connected to the pumps. Given the total time required for the 30 $NH_3/SiCl_4$ pulses, the catalyzed $SiO_2$ CVD rates varied from 0.4 Å/min at 50 mTorr $NH_3$ to 8.1 Å/min at 3.0 Torr $NH_3$.

Figure 3:
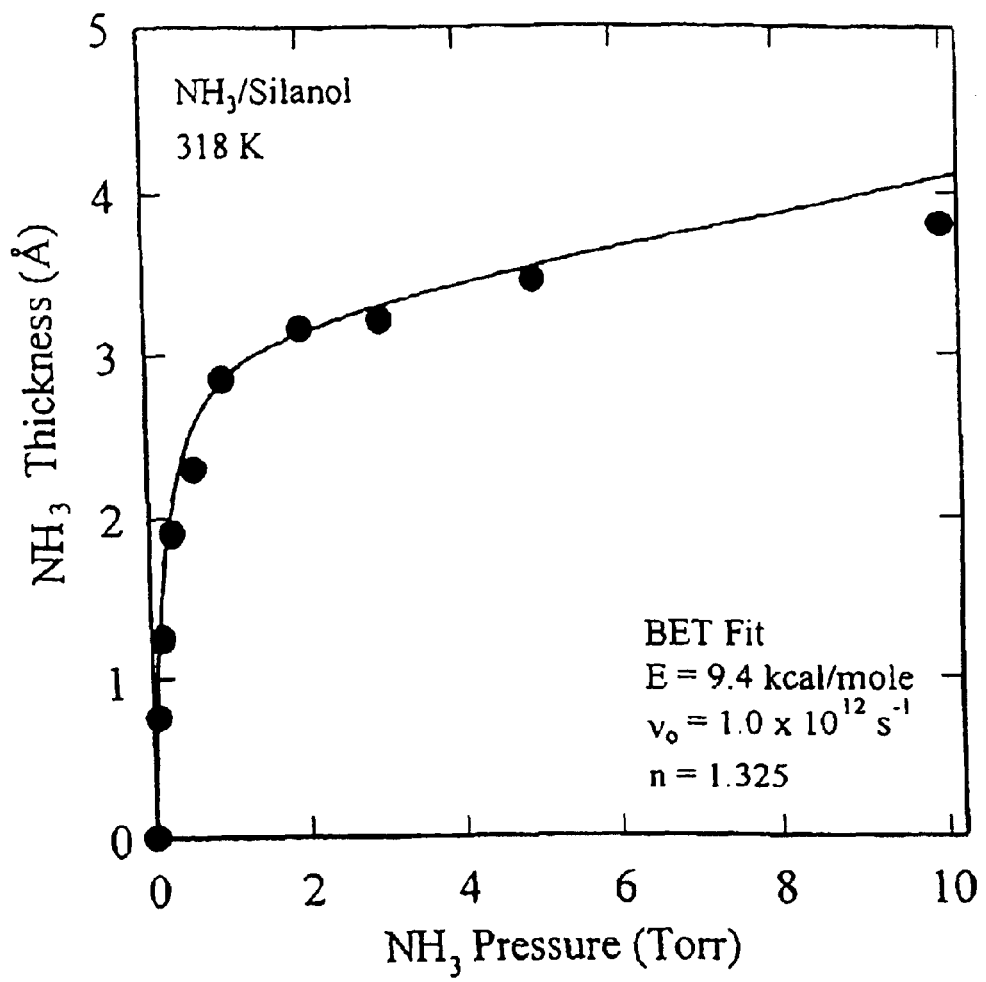
FIG. 3 is a graph of $NH_3$ thickness on the hydroxylated $SiO_2$ surface at 318 K versus $NH_3$ pressure under the conditions of Example 2.

The data in FIG. 2 suggests that enhancement of $SiO_2$ CVD with $NH_3$ pressure results from a progressive increase in $NH_3$ coverage with $NH_3$ pressure. In situ ellipsometry was used to measure the $NH_3$ coverage on a fully hydroxylated $SiO_2$ surface. A refractive index of n=1.325 was utilized based on the previous measurements for liquid ammonia at 289 K as reported by W. L. Jolly and C. J. Hallada, "Liquid Ammonia" in *Non-Aqueous Solvent Systems*, ed. by T. C. Waddington; Academic Press: London, 1965, Chapter 1. FIG. 3 displays the $NH_3$ coverage versus $NH_3$ pressure at 318 K. For $NH_3$ pressures <1 Torr, the $NH_3$ thickness increases rapidly with pressure. In this monolayer regime, the $NH_3$ molecules are adsorbing strongly to surface $SiOH^*$ groups. (As used herein, an asterisk * denotes an active surface species.) The $NH_3$ thickness increases much more slowly at $NH_3$ pressures >1 Torr. At these pressures, the $NH_3$ molecules are adsorbing less strongly onto themselves and form a $NH_3$ multilayer.

The Brunauer-Emmett-Teller (BET) adsorption model was used to fit the ellipsometric data. See J. B. Hudson, *Surface Science: An Introduction*; Butterworth-Heinemann: Troy, N.Y., 1992. The BET model relates $NH_3$ coverage to: $\tau_1$, the $NH_3$ lifetime on the silanol surface; $\tau_2$, the $NH_3$ lifetime on the ammonia multilayer; $n_0$, the $NH_3$ density in one complete monolayer; and I, the incident $NH_3$ flux. A molecular density in the first monolayer of $n_0=7.6\times10^{14}$ molecules/$cm^2$ was obtained from the density of liquid ammonia. The density of liquid ammonia also yields a thickness of 3.6 Å for the $NH_3$ monolayer. The BET fit is shown as the solid line in FIG. 3. The $NH_3$ lifetimes of $\tau_1=3\times10^{-6}$ s and $\tau_2=7\times10^{-9}$ s at 318 K were obtained from this fit.

Additional ellipsometric measurements of the $NH_3$ coverage versus $NH_3$ pressure at different temperatures were consistent with an adsorption energy of $E=9.4\pm0.8$ kcal/mol and a desorption preexponential of $v_0=1.0\times10^{12\pm0.8}$ $s^{-1}$ for $NH_3$ on the silanol surface. Assuming a desorption preexponential of $v_0=1.0\times10^{12}$ $s^{-1}$, the $NH_3$ lifetime of $\tau_2=7\times10^{-9}$ s yielded an adsorption energy of 5.6 kcal/mol for $NH_3$ on the ammonia multilayer. This adsorption energy is in excellent agreement with the heat of vaporation of 5.58 kcal/mol for ammonia at the boiling point.

FIG. 2 displays two $SiO_2$ CVD growth regimes versus $NH_3$ pressure. For $NH_3$ pressures <1 Torr, the $SiO_2$ film thickness deposited by 30 $NH_3/SiCl_4$ pulses increases nearly linearly with $NH_3$ pressure. In contrast, the $SiO_2$ film thickness deposited by 30 $NH_3/SiCl_4$ pulses increases more slowly for $NH_3$ pressures >1 Torr. This $SiO_2$ growth behavior is explained by the $NH_3$ adsorption isotherm at 318 K displayed in FIG. 3.

The $NH_3$ adsorption isotherm shown in FIG. 3 exhibits a turnover at 1 Torr. At this pressure, the $NH_3$ molecules have nearly completed the first monolayer formation by binding to most of the $SiOH^*$ surface species. At pressures >1 Torr, the $NH_3$ molecules adsorb less strongly as a result of $NH_3$ multilayer formation. This decrease in the $NH_3$ adsorption efficiency at >1 Torr is directly reflected by the $SiO_2$ deposition versus $NH_3$ pressure.

EXAMPLE 3

Dependence of $SiO_2$ CVD on $H_2O$ Exposure

The dependence of catalyzed $SiO_2$ CVD on the $H_2O$ exposure was examined by measuring the $SiO_2$ film thickness deposited by 30 consecutive $NH_3/SiCl_4$ pulses at 318 K for various $H_2O$ pressures. The $NH_3$ pressure was 100 mTorr. Each $SiCl_4$ pulse was defined by opening the automated valve for 50 ms to produce a peak $SiCl_4$ pressure of ~5 mTorr in the chamber. The $H_2O$ was allowed to purge the chamber for 20 seconds between each $NH_3/SiCl_4$ pulse.

Figure 4:
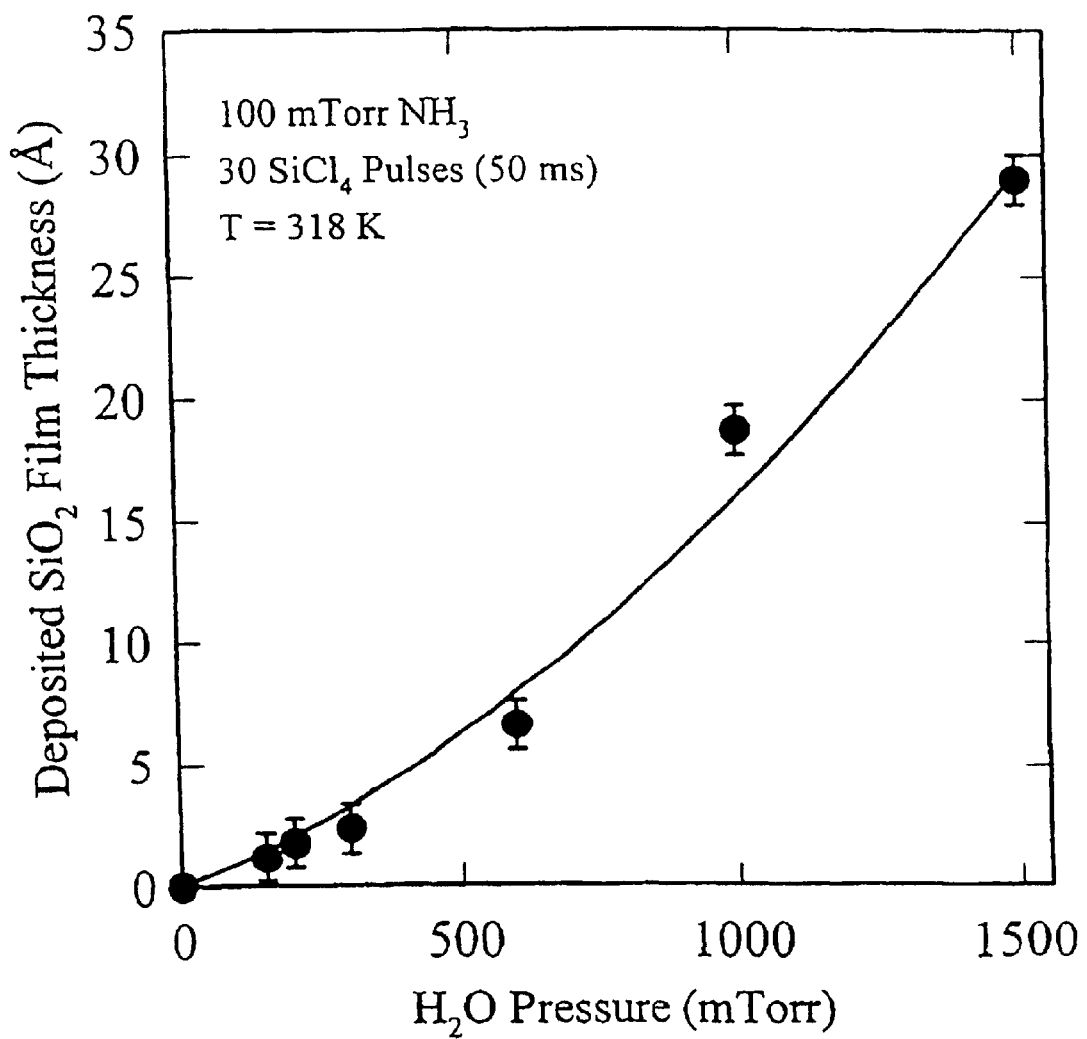
FIG. 4 is a graph of $SiO_2$ film thickness deposited by 30 consecutive $NH_3/SiCl_4$ pulses at 100 mTorr and 318 K versus $H_2O$ pressure under the conditions of Example 3.

FIG. 4 shows that the $SiO_2$ deposited by 30 $NH_3/SiCl_4$ pulses increases rapidly with increasing $H_2O$ pressure from 150 mTorr to 1.5 Torr. The solid line is shown only to guide the eye. Based on the time needed for the 30 $NH_3/SiCl_4$ pulses, the catalyzed $SiO_2$ CVD rate varied from 0.12 Å/min at 150 mTorr $H_2O$ to 3.0 Å/min at 1.5 Torr $H_2O$.

Figure 5:
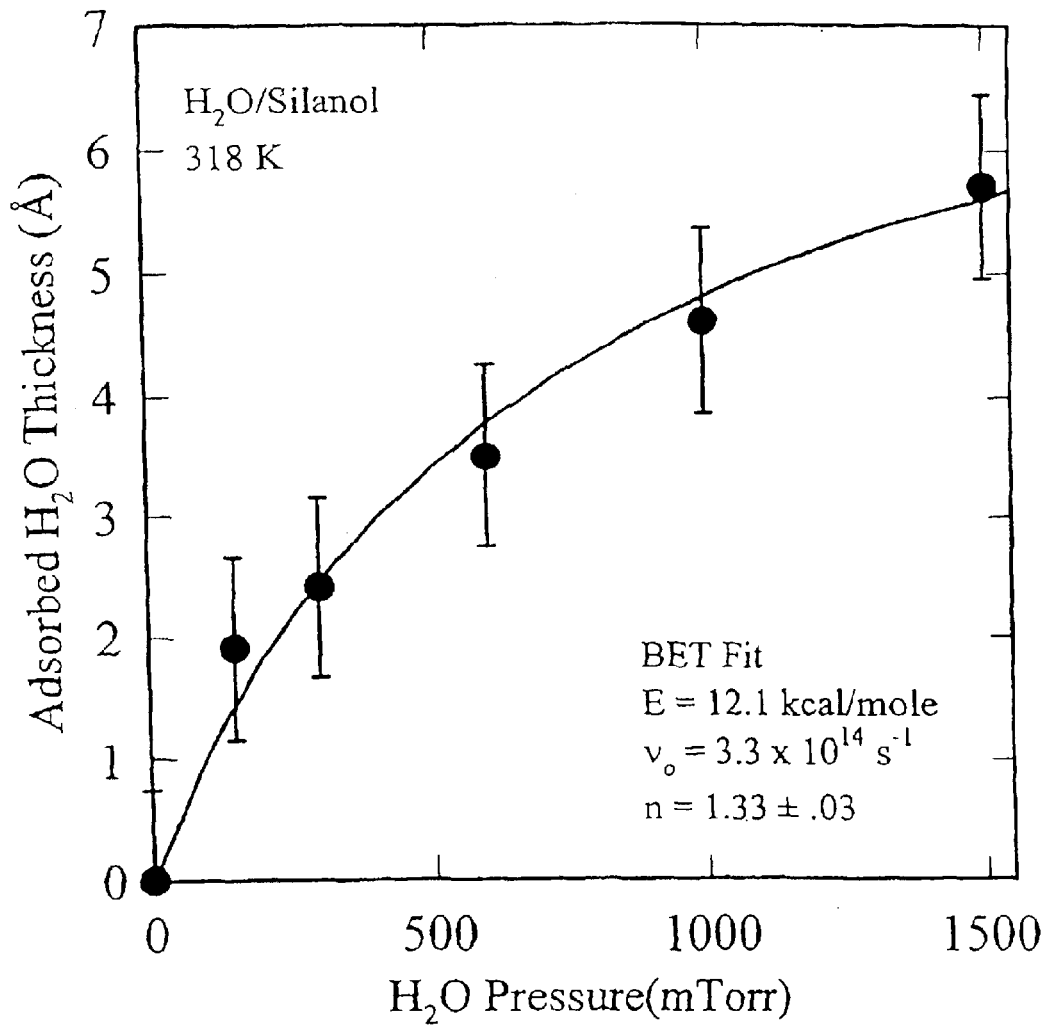
FIG. 5 is a graph of $H_2O$ thickness on a hydroxylated $SiO_2$ surface at 318 K versus $H_2O$ pressure under the conditions of Example 3.

The enhancement of the $SiO_2$ CVD versus $H_2O$ pressure results from a progressive increase in the $H_2O$ coverage with $H_2O$ pressure. In situ ellipsometry was used to measure the $H_2O$ coverage on a fully hydroxylated $SiO_2$ surface. A refractive index of $n=1.33\pm0.05$ was determined for the $H_2O$ multilayer. FIG. 5 displays the $H_2O$ coverage on the silanol surface versus static $H_2O$ pressure at 318 K. For $H_2O$ pressures <500 mTorr, the $H_2O$ thickness increases rapidly with pressure. In this monolayer regime, the $H_2O$ molecules are adsorbing strongly to surface $SiOH^*$ groups. The $H_2O$ thickness increases more slowly at $H_2O$ pressures >500 mTorr. At these $H_2O$ pressures, the $H_2O$ molecules are adsorbing less strongly onto themselves and form a $H_2O$ multilayer.

The Brunauer-Emmett-Teller (BET) adsorption model was again utilized to fit these ellipsometry results. This fit is displayed as the solid line in FIG. 5. From this data and measurements at additional temperatures, the BET model yielded a $H_2O$ surface adsorption energy of $E=12.1\pm0.9$ kcal/mol and a desorption preexponential of $v_0=3.3\times10^{14\pm0.9}$ $s^{-1}$ on the silanol surface at 318 K. A comparison of FIGS. 4 and 5 indicates that the $SiO_2$ CVD rate and the $H_2O$ surface coverage both increase versus $H_2O$ pressure. This correspondence continues in the $H_2O$ multilayer regime at $H_2O$ pressures >500 mTorr. In contrast to the $NH_3$ dependence, the dependence of the catalyzed $SiO_2$ CVD on $H_2O$ pressure displayed in FIG. 4 first increases slowly versus $H_2O$ pressure and then increases more rapidly at $H_2O$ pressures >500 mTorr.

EXAMPLE 4

Dependence of $SiO_2$ CVD on $SiCl_4$ Exposure

Figure 6:
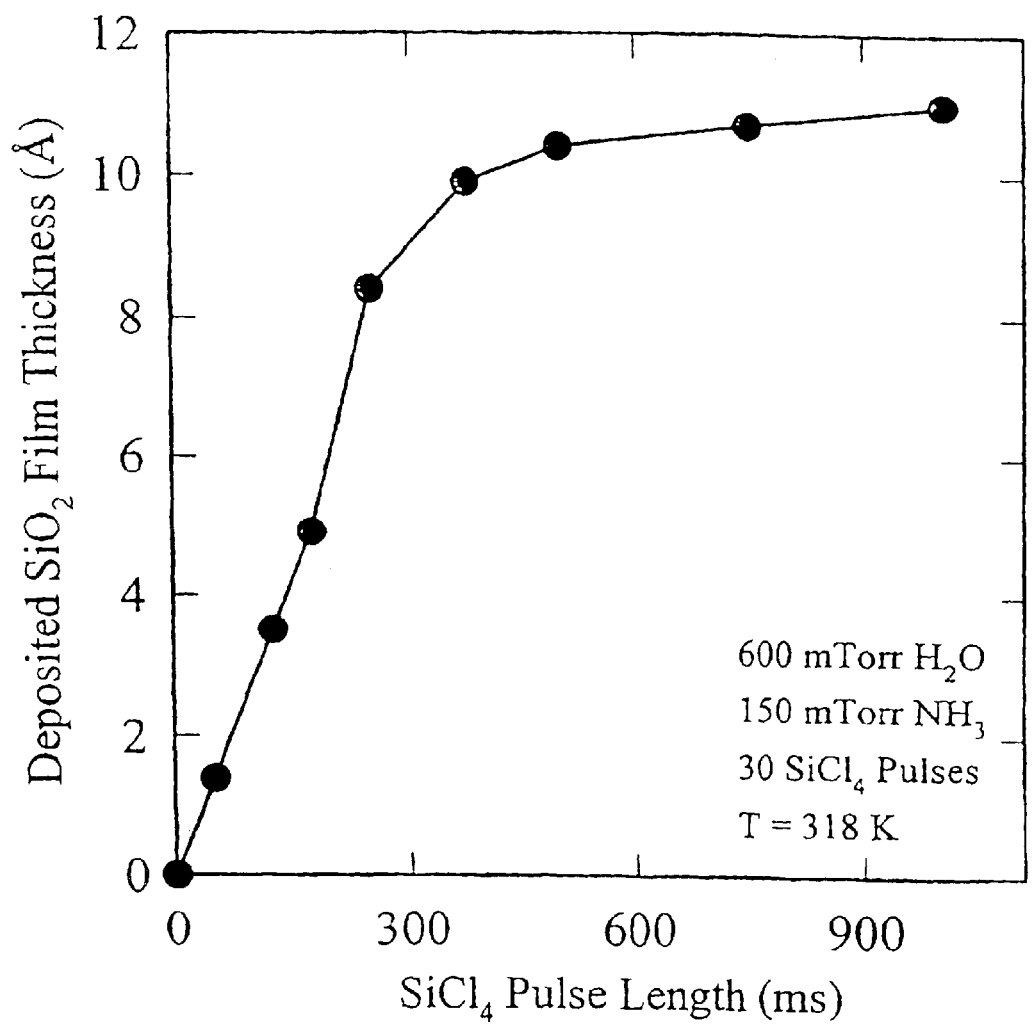
FIG. 6 is a graph of $SiO_2$ film thickness deposited by 30 consecutive $NH_3/SiCl_4$ pulses at 600 mTorr $H_2O$, 150 mTorr $NH_3$ and 318 K versus $SiCl_4$ pulse length under the conditions of Example 4.

Ellipsometric measurements also examined the dependence of the catalyzed $SiO_2$ CVD on $SiCl_4$ exposure. FIG. 6 displays the $SiO_2$ film thickness deposited by 30 consecutive $NH_3/SiCl_4$ pulses at 318 K versus $SiCl_4$ pulse length. The $SiCl_4$ peak pressure during each $SiCl_4$ pulse varied from ~5 mTorr for 50 msec pulse lengths to ~150 mTorr for 1000 msec pulse lengths. The $H_2O$ pressure was 600 mTorr and the $NH_3$ pressure was 150 mTorr. The $H_2O$ was allowed to purge the system for 20 seconds between each $NH_3/SiCl_4$ pulse.

FIG. 6 indicates that there are two distinct $SiO_2$ CVD growth regimes as the $SiCl_4$ pulse length is varied from 10 msec to 1000 msec. The solid line connects the points and is displayed to direct the eye. $SiCl_4$ pulse lengths <300 msec result in $SiO_2$ deposition that is directly proportional to the $SiCl_4$ pulse length. In contrast, $SiCl_4$ pulse lengths $\geq 400$ msec result in $SiO_2$ deposition that is nearly independent of $SiCl_4$ pulse length.

The saturation of the $SiO_2$ deposition at longer $SiCl_4$ pulse lengths is believed to result from $NH_4Cl$ formation. The $NH_4Cl$ salt forms from the complexation of the HCl reaction product with the $NH_3$ catalyst. More HCl reaction product and $NH_4Cl$ salt is produced during the longer $SiCl_4$ pulse lengths. Eventually the $NH_4Cl$ poisons the surface because the $NH_4Cl$ formation rate exceeds the $NH_4Cl$ sublimation rate. The vapor pressure of the $NH_4Cl$ salt varies from $4\times10^{-5}$ Torr at 300 K to $3\times10^{-4}$ Torr at 318 K. The problem of $NH_4Cl$ salt formation does not occur with the $Si(NR_2)_4$, $Si(OH)_a(OR)_{4-a}$ or $SiH_b(OR)_{4-b}$ silicon precursors that do not contain halogens.

Figure 7:
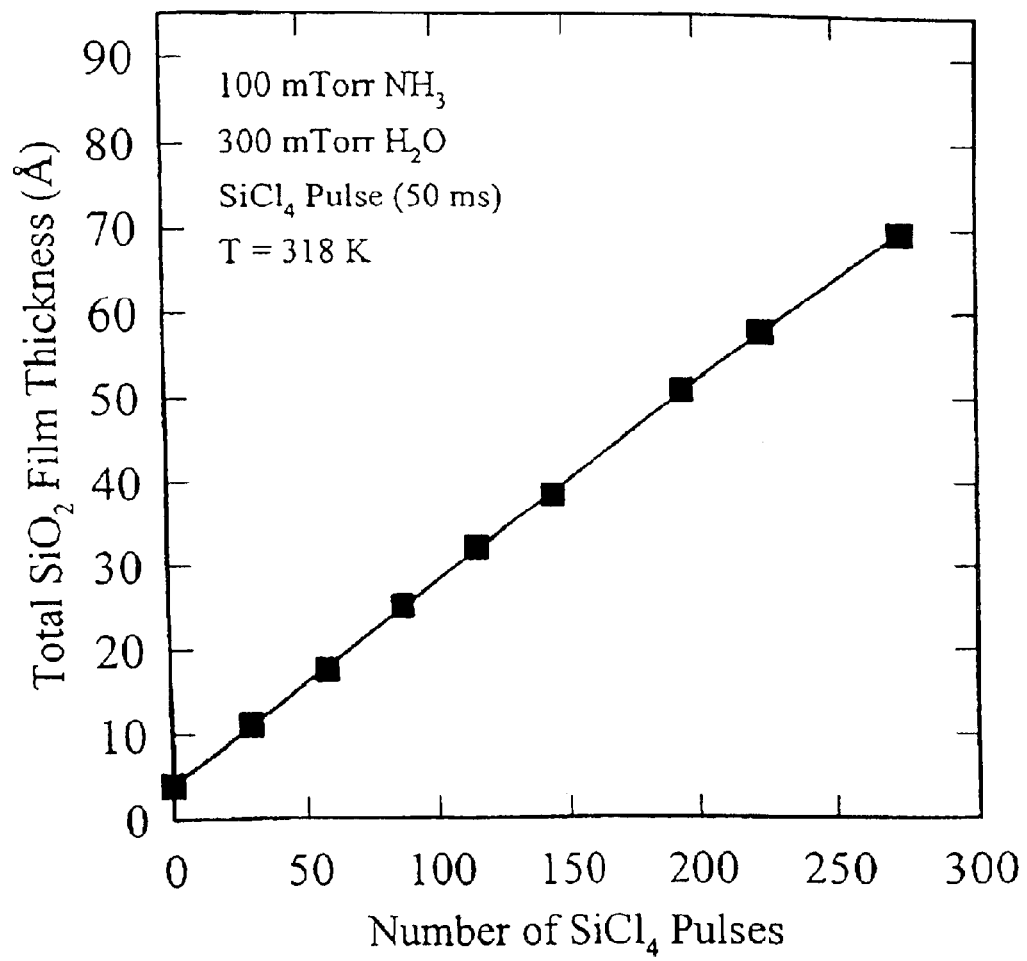
FIG. 7 is a graph of total $SiO_2$ film thickness deposited versus number of $SiCl_4$ pulses at 100 mTorr $NH_3$, 300 mTorr $H_2O$ and 318 K under the conditions of Example 4.

FIG. 7 displays the ellipsometric measurements of the $SiO_2$ film thickness deposited after various numbers of $NH_3/SiCl_4$ pulses. The $H_2O$ pressure was 300 mTorr and the $NH_3$ pressure was 100 mTorr. The $SiCl_4$ pulse length was fixed at 50 msec. The $H_2O$ purged the system for 20 seconds between each $NH_3/SiCl_4$ pulse. FIG. 7 shows that the catalyzed $SiO_2$ CVD is directly proportional to the number of $NH_3/SiCl_4$ pulses. The measured $SiO_2$ CVD rate was 0.24 Å/pulse or 0.72 Å/min at 318 K. The refractive index of these thicker $SiO_2$ films was determined to be n=1.43±0.03.

The linear increase in the $SiO_2$ film thickness versus number of $NH_3/SiCl_4$ pulses indicates that the $SiO_2$ deposition kinetics remain constant versus time. This behavior argues against permanent $NH_4Cl$ salt formation under these reaction conditions. Salt incorporation could poison the $SiO_2$ surface and degrade the $SiO_2$ CVD reaction efficiency. Performing the $SiO_2$ CVD reaction at 318 K enhances the $NH_4Cl$ sublimation rate and prevents the $NH_4Cl$ salt from impairing the $SiO_2$ CVD reaction.

EXAMPLE 5

Surface Properties of $SiO_2$ Films

The surface topography of the $SiO_2$ films was imaged using a NanoScope III atomic force microscope (AFM) from Digital Instruments operating in tapping mode. The AFM images were collected within 1–2 hours of removing the samples from vacuum to prevent surface contamination by ambient dust particles. Scan lengths of 250 nm·1.2 μm were performed using a 1.2 μm scanning head. The AFM images were conditioned to remove AFM artifacts using the software provided by Digital Instruments.

Figure 8:
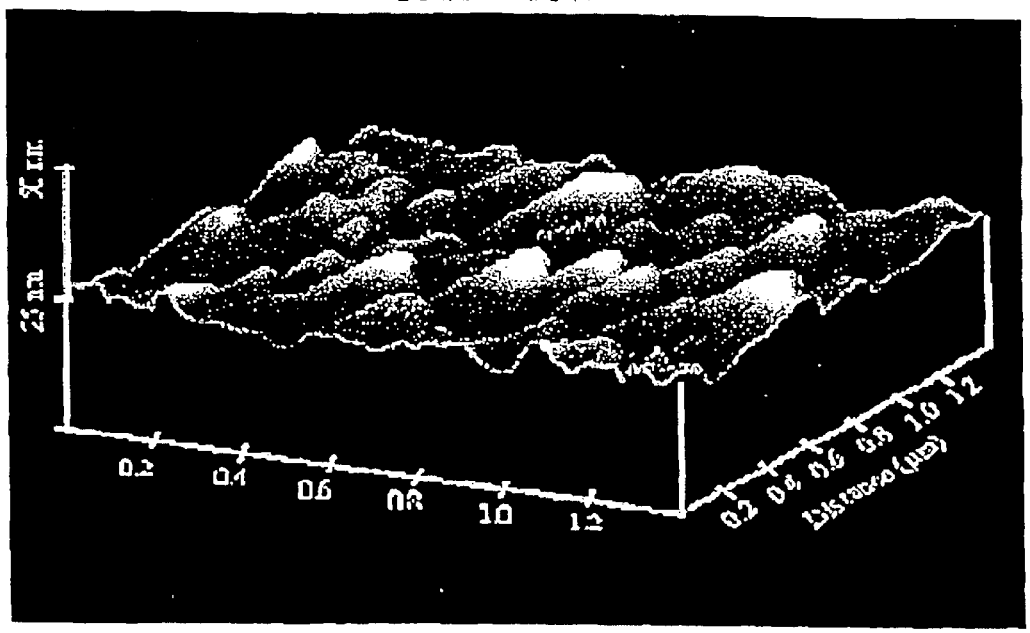
FIG. 8 is an atomic force microscope image of a $SiO_2$ film deposited on Si(100) by 500 consecutive $NH_3/SiCl_4$ pulses at 600 mTorr $H_2O$, 600 mTorr $NH_3$ and 318 K under the conditions of Example 5.
Figure 8:
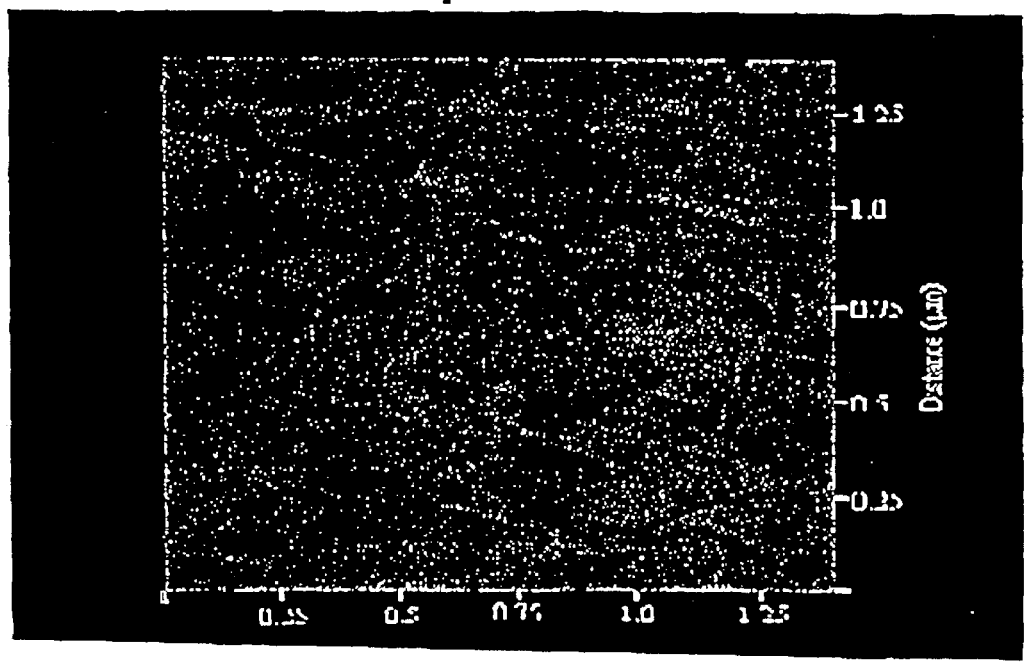

FIG. 8 displays a side view and top view of a $SiO_2$ film deposited at 318 K after 500 $NH_3/SiCl_4$ pulses. The $H_2O$ pressure was 600 mTorr and the $NH_3$ pressure was 600 mTorr. The $SiCl_4$ pulse length was fixed at 100 ms. This $SiO_2$ film had a thickness of ~1000 Å. The surface topography in the AFM image reveals island structures that have grown together and resemble "shingles on a roof". The root mean square (rms) surface roughness obtained from these AFM images was ±15 Å. In comparison, the roughness of the initial cleaned Si(100) substrate was ±2 Å (rms).

The observed surface structure in the AFM image suggests that the catalyzed $SiO_2$ CVD nucleates at various sites on the cleaned Si(100) surface. As the $SiO_2$ growth progresses, the individual $SiO_2$ islands eventually merge with each other. The spatial frequency distribution or power spectral density of the $SiO_2$ surface topography was compared directly with the initial cleaned Si(100) substrate. The spatial frequencies that comprise the $SiO_2$ surface topography are weighted more heavily towards lower frequencies or longer wavelengths. This observation is consistent with the larger island features that dominate the surface topography of the catalyzed $SiO_2$ CVD) films.

EXAMPLE 6

Temperature Dependence of $SiO_2$ Films

Figure 9:
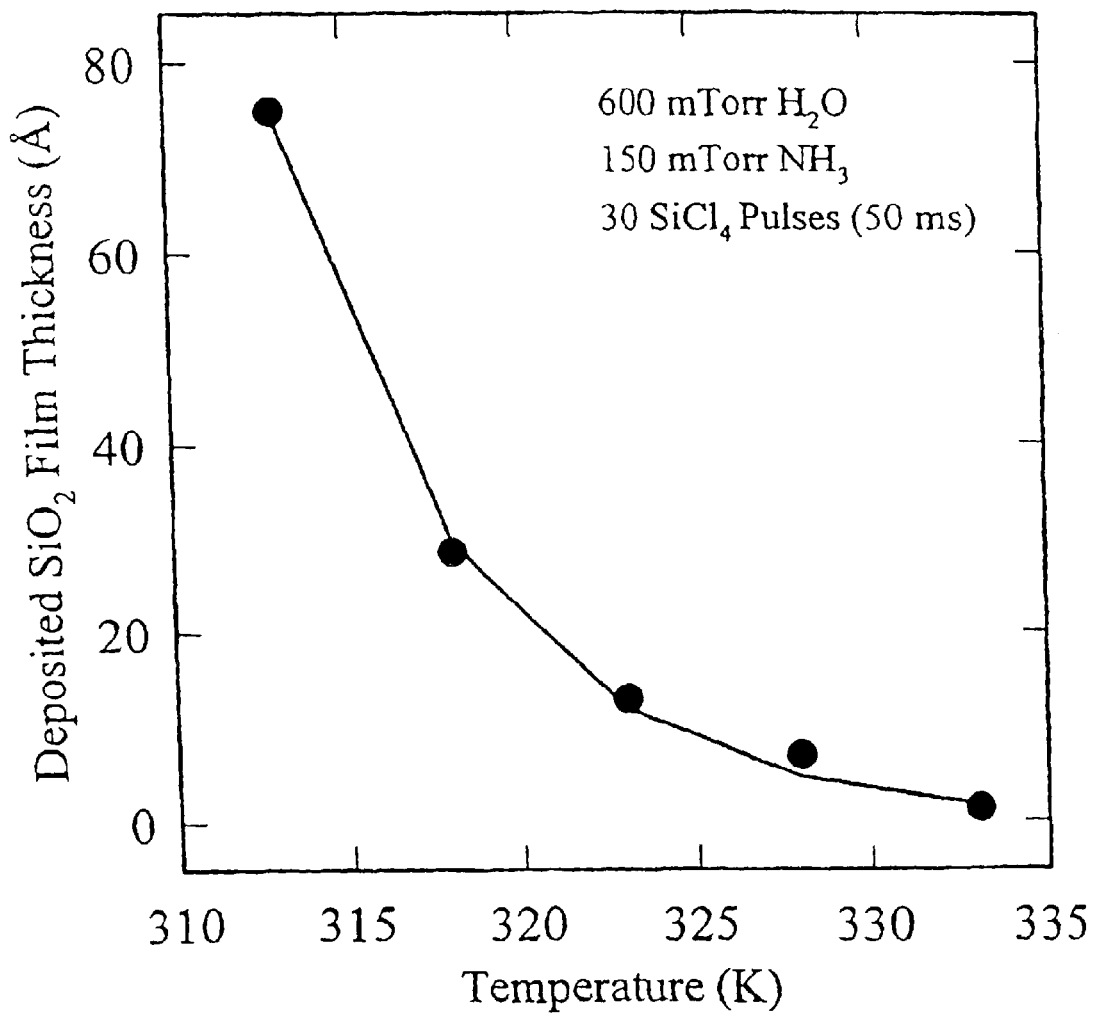
FIG. 9 is a graph of $SiO_2$ film thickness deposited by 30 consecutive $NH_3/SiCl_4$ pulses at 600 mTorr $H_2O$ and 150 mTorr $NH_3$ versus substrate temperature under the conditions of example 6.

The temperature dependence of the catalyzed $SiO_2$ CDV is displayed in FIG. 9. The $H_2O$ and $NH_3$ pressures were 600 mTorr and 150 mTorr, respectively. The $SiCl_4$ pulse length was fixed at 50 msec. The $SiO_2$ film thickness deposited by 30 consecutive $NH_3/SiCl_4$ pulses decreases as the temperature is increased from 313 K to 333 K. The solid line is shown only to connect the data points and direct the eye. Given the total time required for the 30 $NH_3/SiCl_4$ pulses, the $SiO_2$ deposition rate drops from 7.5 Å/min at 313 K to 0.14 Å/min at 333 K. The reduction in the $SiO_2$ growth results primarily from the reduction in the $SiCl_4$, $H_2O$ and $NH_3$ coverages at higher temperatures.

The catalyzed $SiO_2$ CVD exhibits a pronounced decrease with temperature as displayed by FIG. 9. The reduction in $SiO_2$ growth at higher temperatures is the result of two competing processes. The net reaction rate is controlled by the $SiCl_4$, $H_2O$ and $NH_3$ coverages and the rate at which the $SiCl_4$ and $H_2O$ reactants are converted to products. The coverage of the reactants and catalyst should exhibit an exponential decrease with temperature. In contrast, the reaction rate should display a exponential increase with temperature. The reduction in the catalyzed $SiO_2$ CVD rate with increasing temperature indicates that the $SiCl_4$, $H_2O$ and $NH_3$ coverages must dominate the observed $SiO_2$ growth.

EXAMPLE 7

Desorption of $NH_4Cl$

The reaction of the $NH_3$ catalyst with HCl to form the $NH_4Cl$ salt has important implications for catalyzed $SiO_2$ CVD when using the silicon precursors containing chlorine. $NH_4Cl$ salt formation can convert the $NH_3$ catalyst to a chemically inactive form.

The $NH_4Cl$ salt can build up on the $SiO_2$ surface during long $SiCl_4$ pulse lengths and degrade the $SiO_2$ deposition. This $NH_4Cl$ salt formation explains the saturation of the $SiO_2$ deposition at $SiCl_4$ pulse lengths >400 ms in FIG. 6. However, the effect of the $NH_4Cl$ salt can be negligible if $NH_4Cl$ deposition is minimized by pulsing the $SiCl_4$ reactant and providing sufficient time for $NH_4Cl$ sublimation between $SiCl_4$ pulses. To facilitate the removal of the $NH_4Cl$ salt, the $SiO_2$ surface temperature was maintained slightly above room temperature at 313–333 K to promote the sublimation of the $NH_4Cl$ salt back to $NH_3$ and HCl. The desorption rate of $NH_4Cl$ was rapid enough for complete removal of the $NH_4Cl$ salt during the $H_2O$ purge of 20 s between $NH_3/SiCl_4$ pulses.

The formation of the $NH_4Cl$ salt may also have a beneficial effect on the energetics of catalyzed $SiO_2$ CVD. The formation of $NH_4Cl$ from HCl and $NH_3$ is exothermic by 42 kcal/mole. Consequently, $NH_4Cl$ formation provides an enhanced thermodynamic driving force for $SiO_2$ formation from $H_2O$ and $SiCl_4$ and may help to reduce the overall reaction activation barrier.

However, $NH_4Cl$ salt formation alone does not explain the entire catalytic effect of the amine bases. $NH_3$ also has a strong catalytic effect for the silicon precursors such as $Si(OR)_4$ that do not contain chlorine. This catalytic effect is independent of $NH_4Cl$ salt formation because organosilanes do not produce an HCl reaction product that is necessary to form the $NH_4Cl$ salt.

The method of the present invention can be operated at reaction conditions where $NH_4Cl$ salt formation does not degrade the $SiO_2$ CVD growth rate. FIG. 7 illustrates that $SiO_2$ films can easily be deposited at rates of 0.24 Å per $NH_3/SiCl_4$ pulse or 0.72 Å/min at 318 K. Higher $SiO_2$ deposition rates of >16 Å/min can be achieved by varying the $SiCl_4$, $H_2O$ and $NH_3$ pressures.

Also, the deposited $SiO_2$ films are very smooth as revealed by FIG. 8. The $SiO_2$ films display a surface roughness of only ±15 A (rms) for a deposited $SiO_2$ film thickness of 1000 A. This minimal surface roughness corroborates that $NH_4Cl$ salt formation does not interfere with the catalyzed $SiO_2$ growth.

EXAMPLE 8

$SiO_2$ Film Quality and Stoichiometry.

Rutherford Backscattering (RBS) experiments were performed on several catalyzed $SiO_2$ CVD films to evaluate the film quality and stoichiometry. The RBS investigations employed a 2.45 MeV $He^{2+}$ primary ion beam. The backscattered ions were collected from the sample at ~20° off-specular. The H content of the films was also evaluated by collecting the $H^+$ions that were forward-scattered from the $SiO_2$ film.

The RBS measurements obtained an elemental ratio of 2.1/1 for 0/Si. These results reveal that the deposited film is nearly stoichiometric $SiO_2$. The N/Si atomic ratio was below the detection threshold of the RBS measurements, i.e. <0.02%. This small upper limit for N indicates that the $NH_3$ catalyst is not incorporating into the $SiO_2$ film when using the $SiCl_4$ and $H_2O$ reactants.

The RBS analysis also revealed that the Cl/Si atomic ratio was <0.02%. This low ratio is consistent with a complete reaction between the $H_2O$ and $SiCl_4$ reactants. Modest levels of carbon (~1%) and some heavy metal contaminants were also detected in the $SiO_2$ films. The carbon impurities probably are derived from small hydrocarbon partial pressures in the deposition chamber that is pumped by a liquid N2 trapped diffusion pump and operates at a base pressure of $1 \times 10^{-7}$ Torr.

Rutherford backscattering (RBS) investigations did not observe any N or Cl contaminants in the $SiO_2$ films. Thus, although the $NH_4Cl$ may interfere with $SiO_2$ deposition under some reaction conditions, there is no evidence that $NH_4Cl$ is incorporated in the $SiO_2$ CVD films. These RBS results argue that the growth temperatures of 313–333 K during the $SiCl_4$ and $H_2O$ reactions were sufficient for complete removal of the $NH_4Cl$ salt from the $SiO_2$ surface during the $H_2O$ purge.

$NH_3$ can react with $SiCl_4$ to form $Si_3N_4$ under certain conditions. $SiCl_4$ and $NH_3$ have also been employed earlier to obtain $Si_3N_4$ (ALD) using sequential surface reactions. However, the $SiCl_4$ and $NH_3$ half-reactions during $Si_3N_4$ ALD have a negligible rate at T <700 K. Further, the reaction between $SiCl_4$ and $NH_3$ in the gas phase is also inconsequential at room temperature.

In accordance with the present invention, it has been demonstrated that $NH_3$ can be used as a catalyst for the $SiCl_4+2H_2O \rightarrow SiO_2+4HCl$ and $Si(OR)_4+2H_2O \rightarrow SiO_2+4ROH$ reactions at room temperature. The precursors are inexpensive and widely available. Because the catalyzed process can be used at such low temperatures, it facilitates the use of temperature sensitive substrates such as polymers or biological materials in electronic devices. The catalyzed CVD process in accordance with the present invention may be applied to the growth of other materials.

What is claimed is:

1. A chemical vapor deposition, process for forming a $SiO_2$ layer on a substrate comprising reacting water with a silicon precursor compound having the structure $SiX_4$, $Si(NR_2)_4$, $Si(OH)_a(OR)_{4-a}$ or $SiH_b(OR)_{4-b}$ wherein R is an alkyl group, each X is independently a halogen atom, and a and b are numbers from 0–4, in the presence of the substrate at a temperature of between about 290 K and 350 K and in the presence of ammonia or a Lewis base catalyst that is a gas under the conditions of the chemical vapor deposition process, wherein water is continually added to the process, and the silicon precursor is added intermittently.

2. The process of claim 1 wherein the ammonia or Lewis base is added intermittently to the process.

3. The process of claim 2 wherein the silicon precursor is added during the addition of the ammonia or Lewis base.

4. The process of claim 2 wherein the silicon precursor is $SiCl_4$ or TEOS.

5. The process of claim 4 wherein ammonia is added to the process.

6. The process of claim 2 wherein the Lewis base catalyst is a primary, secondary or tertiary amine.

7. A chemical vapor deposition process for forming a $SiO_2$ layer on a substrate comprising reacting water with a silicon precursor compound having the structure $SiX_4$, $Si(NR_2)_4$, $Si(OH)_a(OR)_a(OR)_{4-a}$ or $SiH_b(OR)_{4-b}$ wherein R is an alkyl group, each X is independently a halogen atom, and a and b are numbers from 0–4, in the presence of the substrate at a temperature of between about 290 K and 350 K and in the presence of ammonia or a Lewis base catalyst that is a gas under the conditions of the chemical vapor deposition process, and further wherein the silicone precursor is introduced into the process simultaneously with water and the ammonia or Lewis base catalyst.

8. The process of claim 7 wherein the silicon precursor is $SiCl_4$ or $Si(OR)_4$ where each R contains up to four carbon atoms.

9. The process of claim 8 wherein the ammonia or Lewis base is added intermittently to the process and the silicon precursor is added during the addition of the ammonia or Lewis base.

10. The process of claim 9 wherein ammonia is added to the process.

11. The process of claim 9 wherein the Lewis base catalyst is a monoalkyl, dialkyl or trialkyl amine.

12. The process of claim 7 wherein the temperature is from about 313 to about 333 K.

* * * * *

UNITED STATES PATENT AND TRADEMARK OFFICE
CERTIFICATE OF CORRECTION

PATENT NO.         : 6,818,250 B2                                         Page 1 of 1
APPLICATION NO. : 09/896955
DATED              : November 16, 2004
INVENTOR(S)        : Steven M. George and Jason W. Klaus It is certified that error appears in the above-identified patent and that said Letters Patent is hereby corrected as shown below:

At column 1, line 14, "the United States Department of Energy" is to be stricken and replaced with --the Air Force Office of Scientific Research--.

Signed and Sealed this

Twenty-ninth Day of April, 2008

JON W. DUDAS
*Director of the United States Patent and Trademark Office*